United States Patent
Pisati et al.

(12) 
(10) Patent No.: US 6,707,623 B2
(45) Date of Patent: Mar. 16, 2004

(54) CIRCUIT DEVICE FOR RESTORING THE SYMMETRY OF AN ANALOG SIGNAL ORIGINATED BY THE READING OF DATA FROM MAGNETIC SUPPORTS

(75) Inventors: Valerio Pisati, Bosnasco (IT); Marco Demicheli, Binago (IT); Melchiorre Bruccoleri, Rho (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 252 days.

(21) Appl. No.: 09/802,748

(22) Filed: Mar. 8, 2001

(65) Prior Publication Data

US 2001/0040746 A1 Nov. 15, 2001

(30) Foreign Application Priority Data

Mar. 9, 2000 (IT) ...................... MI2000A0469

(51) Int. Cl.[7] .................................. G11B 5/02
(52) U.S. Cl. ............................. 360/25; 360/46; 360/53
(58) Field of Search ........................ 360/25, 46, 67, 360/53, 65; 330/254; 327/14, 306, 317, 551, 563, 545, 546

(56) References Cited

U.S. PATENT DOCUMENTS

| | | | | |
|---|---|---|---|---|
| 4,786,890 A | * | 11/1988 | Marcus et al. | 360/40 |
| 5,805,022 A | * | 9/1998 | Bruccoleri et al. | 360/46 |
| 6,043,943 A | * | 3/2000 | Rezzi et al. | 360/46 |
| 6,510,012 B1 | * | 1/2003 | Chaiken et al. | 360/25 |
| 6,529,340 B2 | * | 3/2003 | Gowda et al. | 360/25 |

* cited by examiner

*Primary Examiner*—Alan T. Faber
(74) *Attorney, Agent, or Firm*—Lisa K. Jorgenson; E. Russell Tarleton; Seed Intellectual Property Law Group PLLC

(57) ABSTRACT

A circuit device for restoring the symmetry of an analog signal originated by the reading of data from magnetic supports, including at least one differential cell multiplier whose cell includes a pair of input MOS transistors having respective conduction terminals linked together at a circuit node. Advantageously, provided in parallel with each of the cell input transistors, are a plurality of transistors individually connectable to and disconnectable from each of the input transistors by corresponding switches.

14 Claims, 2 Drawing Sheets

CIRCUIT DEVICE FOR RESTORING THE SYMMETRY OF AN ANALOG SIGNAL ORIGINATED BY THE READING OF DATA FROM MAGNETIC SUPPORTS

TECHNICAL FIELD

This invention relates to a circuit device for restoring the symmetry of an analog signal originated by the reading of data from magnetic supports, and more particularly, relates to a circuit device for restoring the symmetry of an analog signal originated by the reading of data from magnetic supports, which device comprises at least one differential cell multiplier whose cell includes a pair of input MOS transistors having respective conduction terminals linked together at a circuit node.

BACKGROUND OF THE INVENTION

As is well known, disk units are commonly employed in computers for storing and reading data. Disk drive units conventionally comprise stacked magnetic hard disks which can be set in rotary motion. Data is stored onto these disks in a magnetic format, and data is written to and read from these disks by means of magnetoresistive heads.

The data is recorded in radially concentric tracks which are spaced apart across a surface of each magnetic disk. The magnetoresistive heads are steered along predetermined paths to and from the disk surface for the purpose of reading or writing data.

To obtain high storage densities and a large proportion of data for read/write processing, sampling and sensing techniques are used with PRML (Partial Response signaling—Maximum Likelihood) channels.

For example, a sequential PRML sensing technique is used conventionally in applications relating to digital data communication and recording, as described in U.S. Pat. No. 4,786,890.

To fully benefit from the advantages of the PRML technique, a received or sense signal is to go through an appropriate equalizing filter which will output a signal spectrum corresponding to the waveform for which the maximum-likelihood detector has been designed.

Where a digital filter is used in a PRML system, the filter is usually placed between an analog/digital converter (ADC) and other circuitry arranged to control the system and execute the sensing operation.

Unfortunately, conventional read channels often experience problems connected with data processing rate and power requirements of the operation.

With recent PRML channels and magnetoresistive heads, the output signal from a head shows asymmetries of amplitude in the positive and negative signals, which asymmetries depend on the point of static bias of the head and on flight altitude during the transfer phases.

FIG. 1 of the accompanying drawings shows schematically a graph wherein the symmetric response of the channel is plotted on the abscissa axis and the variation in resistance of the head plotted on the ordinate axis. It can be evinced from this graph that the waveform of the signal departs from a true parabola at opposed ends. Such departures are due to demagnetization fields.

Before a signal such as this is subjected to analog/digital conversion for the purpose of processing the data in the digital format, it is expedient to rectify the asymmetries by normalizing the read signal with an amplification, e.g., by means of a VGA (Variable Gain Amplifier). In fact, it is preferable to operate at constant amplitude after the signal is filtered through a loop integrator, e.g., of the AGC type, that is after the loop has settled, the AGC loop being effective to settle the peak-to-peak ratio of the signal.

As a preliminary approximation, the asymmetry of a signal is quadratic in nature, and the response g(t) from an asymmetric channel is given as:

$$g(t)=h(t)-C_{asymm}h(t)^2$$

where, h(t) is the response from the symmetric channel.

Assuming the maximum value of h(t) to be 1, then the amplitude ratio of the positive and negative peaks will be the value of the asymmetry.

FIG. 2 is a schematic block diagram of a resolutive circuit according to the prior art, intended to restore the symmetry of an output signal from a read head. The block is generally referenced 1.

The signal $x_{MR}(t)$ from the VGA is input to a multiplier block 2, which block is usually in the form a feedforward type of four-quadrant multiplier.

The output signal from the block 2 is applied to an amplifier 3 having an amplification parameter $\alpha$.

This amplifier 3 receives, from a five-bit digital/analog converter 4, a signal MRA representing an amplitude asymmetry sensed by a read head.

The amplifier 3 outputs a signal $x_{MRAC}(t)$ which is then applied to a summing node 5.

The summing node 5 also receives the original signal $x_{MR}(t)$ through a delay block 6 which is only operative to equalize the delays, so that the same phase relation can be had at the output.

Thus, the sum carried out in the summing node 5 will result in a signal $x_{OUT}(t)$ being output to a low-pass filter.

The relations on which the operation of the above prior solution is based will now be reviewed.

The input signal is raised to the second power and amplified by the parameter $\alpha$ in the first leg, and is only retarded through the second leg. The outcome of these operations is:

$$x_{MR}(t)=x(t)+\alpha^* x^2(t)$$

The signal $x_{MRAC}(t)$ is expressed by the following relation:

$$x_{MRAC}(t)=\alpha'(x^2(t)+2\alpha^* x^3(t)+\alpha^{2*} x^4(t));$$

where, $\alpha'$ approximately equals $\alpha$, since the terms of the second order may be neglected.

It follows from the above that the value of the output signal $x_{OUT}(t)$ can be calculated as:

$$x_{OUT}(t)=x_{MR}(t)-x_{MRAC}(t)=x(t)+\alpha^* x^2(t)-\alpha'(x^2(t)+2\alpha^* x^3(t)+\alpha^{2*} x^4(t));$$

whence:

$$x_{OUT}(t)=x(t).$$

While being in several ways advantageous, this prior solution only enables positive or negative asymmetries to be suppressed, at the expense of enhanced circuit complexity and power consumption.

Furthermore, for the multiplier block, a Gilbert's CMOS multiplier with four quadrants is usually employed which is slow and not so accurate.

The underlying technical problem is to provide a circuit device for restoring the symmetry of the analog signal output from a read head for reading data stored in magnetic supports, which device has such structural and functional features as to altogether suppress asymmetries by means of a circuit structure that is uniquely simple and effective, thereby overcoming the limitations of prior art solutions.

SUMMARY OF THE INVENTION

The principle on which the disclosed embodiment of this invention stands is one of using a multiplication cell with variable transconductance, which cell has a pair of input transistors associated with a plurality of transistors selectively connectable in parallel with each of said input transistors by means of corresponding switches.

Based on this principle, the technical problem is solved by a device as previously indicated that provides in parallel with each of the cell input transistors a plurality of transistors that are selectively connectable individually to each of the input transistors by corresponding switches.

Advantageously, each transistor of said plurality is connected in series with a respective current generator, between a supply voltage (vcc) and ground, and a conduction terminal of each transistor is connected to said node by a respective switch.

BRIEF DESCRIPTION OF THE DRAWINGS

The features and advantages of a device according to the disclosed embodiment of the invention will be apparent from the following description of an embodiment thereof, given by way of example and not of limitation with reference to the accompanying drawings, wherein.

DETAILED DESCRIPTION OF THE INVENTION

Figure 1:
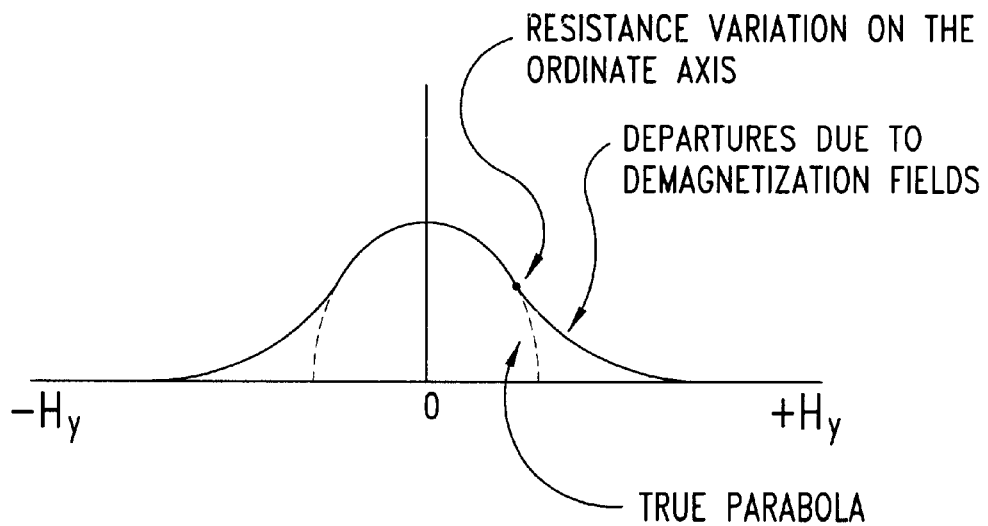
FIG. 1 is a schematic graph of a prior design where the symmetric response of a PRML channel is plotted on the abscissa axis, and the variation in resistance of a magnetic support reading head is plotted on the ordinate axis.
Figure 2:
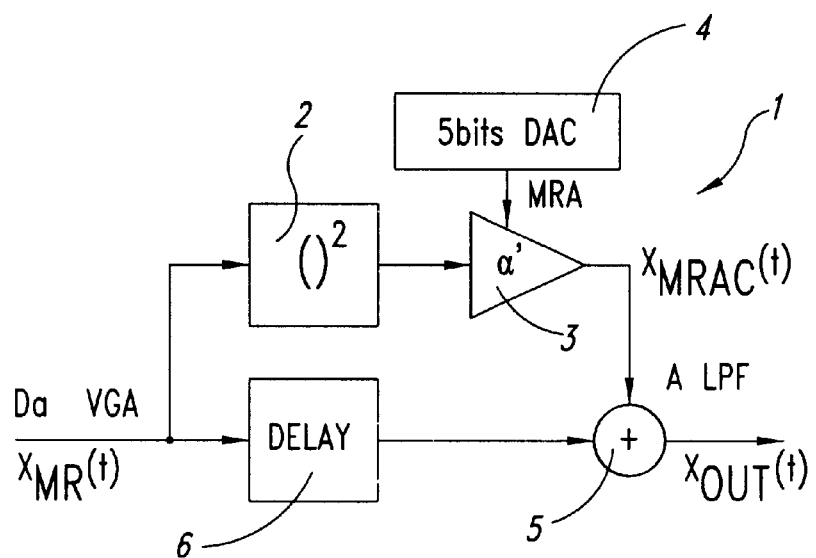
FIG. 2 is a block diagram illustrating schematically a prior circuit design for restoring the symmetry of the analog signal output from a magnetic support reading head.
Figure 3:
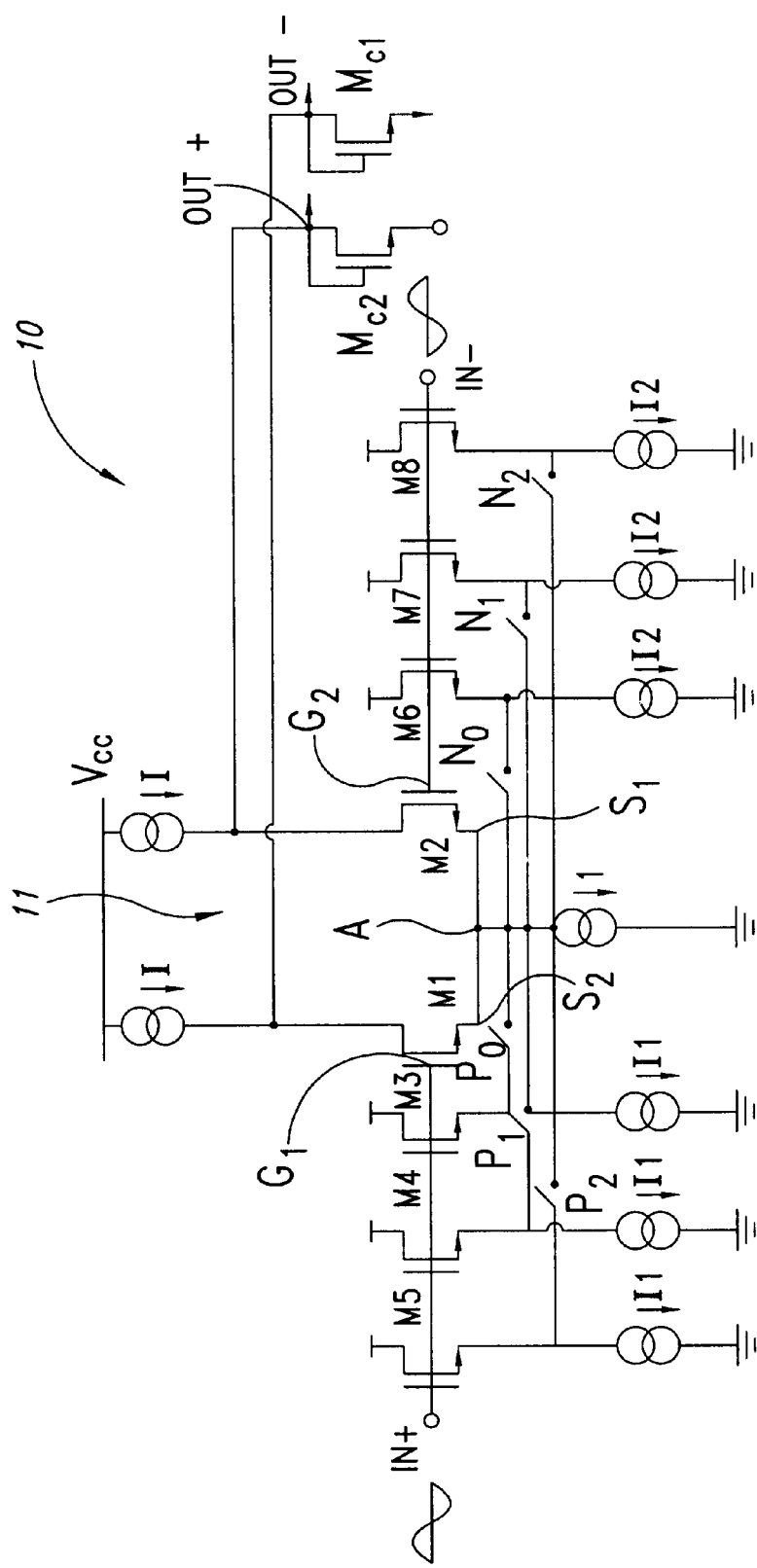
FIG. 3 is a detail circuit diagram of a device according to the invention.

With reference to the drawings, and in particular to the embodiment shown in FIG. 3, a circuit device for restoring the symmetry of an analog signal originated by the reading of data from magnetic supports is generally shown at 10 in schematic form.

Magnetic supports are here either the hard disks of a file store incorporated in a computer, or any other types of supports for storing and reading data by means of magnetoresistive read/write heads. Reference will be made throughout the remainder of this description to this application by way of example without implying any limitations to the scope of the invention.

The device 10 is an analog multiplier, and comprises a differential cell 11 containing MOS transistors.

The cell 11 comprises a pair of input transistors M1, M2 having respective conduction terminals, such as the source terminals S1 and S2, linked together at a circuit node A. The transistors M1 and M2 are N-channel transistors.

The gate terminal G1 of one M1 of these transistors is applied an input signal IN+, and the gate terminal G2 of the other M2 of the transistors is applied the reciprocal IN− of said input signal.

The node A is connected to a voltage reference, e.g., a ground GND, through a current generator 1.

The drain terminals of the transistors M1, M2 also form the output terminals of the device 10.

More particularly, a first output OUT−, corresponding to the drain terminal of the transistor M1, is connected to ground GND through a load transistor Mc1. The transistor Mc1 is of minimum area to minimize parasitic capacitance.

The second output OUT+, corresponding to the drain terminal of the transistor M2, is connected to ground GND through a load transistor Mc2. The transistor Mc2 is also of minimum area to minimize parasitic capacitance.

The transistors Mc1, Mc2 are in a diode configuration, with the respective source and gate terminals connected together. It is as if the differential cell 11 had essentially a pair of output resistors.

Advantageously, arranged in parallel with each of the input transistors M1 and M2 of the cell 11, are a plurality of transistors which can be connected/disconnected individually to and from each input transistor through respective switches.

For example, an N-channel transistor M3 is connected in series with a current generator I1, between the power supply Vcc and ground. A conduction terminal, e.g., a source terminal, of the transistor M3 is connected to the node A through a switch Po.

The gate terminal of the transistor M3 is connected to the gate terminal G1 of the input transistor M1.

The generator I1 may have the same value as the current generator I.

Another transistor M4 is connected in series with a current generator I1, between the power supply Vcc and ground. The source terminal of the transistor M4 is connected to the node A through a switch P1.

The gate terminal of the transistor M4 is connected to the gate terminal G1 of the input transistor M1.

A further transistor, M5, is connected in series with a current generator I1, between the supply Vcc and ground. The source terminal of the transistor M4 is connected to the node A through a switch P2.

The gate terminal of the transistor M5 is connected to the gate terminal G1 of the input transistor M1.

The switches Po, P1, P2 can be implemented by P-channel MOS transistors.

Likewise, as regards the other M2 of the input transistors, an N-channel transistor M6 is connected in series with a current generator I2, between the power supply Vcc and ground. The source terminal of the transistor M6 is connected to the node A through a switch No.

The gate terminal of the transistor M6 is connected to the gate terminal G2 of the input transistor M2.

The generator I2 may have the same value as the current generator I1 and the current generator I.

Another transistor M7 is connected in series with a current generator I2, between the power supply Vcc and ground. The source terminal of the transistor M7 is connected to the node A through a switch N1.

The gate terminal of the transistor M7 is connected to the gate terminal G2 of the other M2 of the input transistors.

A further transistor, M8, is connected in series with a current generator I2, between the supply Vcc and ground. The source terminal of the transistor M8 is connected to the node A through a switch N2.

The gate terminal of the transistor M8 is connected to the gate terminal G2 of the input transistor M2.

The switches No, N1, N2 may be implemented by N-channel MOS transistors.

Although in the above non-limitative embodiment, three transistors are associated with each input transistor of the differential cell, a larger or smaller number of transistors could be associated therewith to meet specific requirements.

The operation of the circuit structure according to the invention will now be described briefly.

The device 10 is capable of rectifying positive or negative asymmetries in the input signals following operation of any of the switches Po, P1, P2 or No, N1, N2.

Assume, for example, that the transistor M3 is connected to the transistor M1 in parallel by closing the switch Po. Then, it will be as if a differential stage having a predetermined amount of offset at one of its inputs were provided.

The outcome of this option (closed Po) is that a current is injected into the node A.

This current is only dependent on the single-ended signal, and this will cause an asymmetry to appear in the output voltage.

Essentially, the circuit of this invention operates to introduce an amount of offset in the side which requires asymmetry correction due to previous unbalance.

According to the type (positive or negative) and the amount of the asymmetry, the switch to be closed can be selected by a suitable controller (not shown) configured to detect the asymmetry and to connect one or more transistors in parallel with each transistor of the input pair M1, M2.

The outcome of this operation is that the signal will be current, rather than voltage, summed at the node A.

The device of this invention does solve the technical problem, and offers a number of advantages, foremost among which is that asymmetries, even substantial ones, in analog output signals from the read heads for hard disks used as file stores can be rectified by this multiplier structure.

The asymmetry rectification will be especially effective with frequencies of up to 200 MHz.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A circuit device for restoring the symmetry of an analog signal originated by the reading of data from magnetic supports, comprising at least one differential cell multiplier that includes a pair of input MOS transistors having respective conduction terminals linked together at a circuit node and provided in parallel with each of the cell input transistors are a plurality of transistors with associated current generators individually connectable to and disconnectable from the conduction terminals of each of the input transistors by corresponding switches.

2. The device of claim 1, wherein each transistor of said plurality is connected in series with a respective current generator, between a supply voltage and ground, and a conduction terminal of each transistor of said plurality is connected to said node by a respective switch of the corresponding switches to sum up the input signal on the conduction terminals and to sum up the currents from the respective current generators.

3. The device of claim 1, wherein the transistors of said plurality are N-channel MOS transistors.

4. The device of claim 1, wherein the switches of the corresponding switches that are associated with one of said input transistors are MOS transistors having an opposite type of channel from the switches of the corresponding switches that are associated with the other of said input transistors.

5. The device of claim 1, comprising a current generator connected between said node and ground.

6. The device of claim 1, wherein each transistor of said plurality has the control terminal connected to the gate terminal of either one of said input transistors.

7. A circuit for restoring the symmetry of an analog signal originated by the reading of data from magnetic devices, the circuit comprising:
 a fully differential MOS input circuit having first and second inputs to receive the analog signal;
 a first symmetry restoring circuit coupled to the first input and a second symmetry restoring circuit coupled to the second input, each of the first and second symmetry restoring circuits having a current generator circuit that is selectively coupled to a common conduction terminal of the fully differential input circuit by respective switches in response to an asymmetric condition of the analog input signal to thereby restore symmetry to the analog input signal.

8. The circuit of claim 7, wherein the first symmetry restoring circuit and the second symmetry restoring circuit each comprise at least one transistor coupled between a supply voltage and ground and having a control terminal coupled to the respective input of the fully differential input circuit, the current generator circuit comprising at least one current generator coupled between the respective transistor and the ground.

9. The circuit of claim 8, wherein the first and second symmetry restoring circuits are each selectively coupled to the common conduction terminal by a respective switch coupled between the common conduction terminal and a node at the connection of the respective transistor and the respective current generator.

10. The circuit of claim 9, further comprising a current generator coupled between the common conduction terminal and the ground terminal.

11. A method for restoring the symmetry of an analog signal originated by the reading of data from magnetic supports, the method comprising:
 detecting an asymmetric analog input signal condition at a differential MOS input circuit having a common conduction terminal coupled to ground;
 varying the transconductance of the differential input circuit in response to detecting the asymmetric analog input signal condition to thereby restore the symmetry of the analog input signal by coupling a current generator to the common conduction terminal of the differential input circuit with switches in response to detecting an asymmetric analog input signal condition.

12. The method of claim 11, wherein coupling the current generator comprises inputting the asymmetric analog input signal to a control terminal of a transistor coupled between the current generator and a voltage source, and connecting a node between the transistor and the current generator to the common conduction terminal.

13. The method of claim 12, comprising supplying a current from a current generator coupled between the common conduction terminal and the ground terminal.

14. A circuit device for restoring the symmetry of an analog signal, comprising:
 at least one differential cell multiplier having a pair of input MOS transistors receiving first and second input signals and having respective conduction terminals linked together at a circuit node;

a plurality of transistors coupled to associated current generators that generate a respective current; and a plurality of switches, each switch coupled between a respective transistor and associated current generator on one terminal and to the conduction terminals of each of the input transistors, the switches configured to couple the current generators and associated transistors to the conduction terminals of the pair of input MOS transistors in response to asymmetry in the first and second input signals to sum up the first and second input signals and the currents from the respective current generators on the conduction terminals.

* * * * *